(12) United States Patent
Kuroiwa

(10) Patent No.: US 6,353,404 B1
(45) Date of Patent: *Mar. 5, 2002

(54) D/A CONVERSION APPARATUS AND D/A CONVERSION METHOD

(75) Inventor: Kiyoto Kuroiwa, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/564,203

(22) Filed: May 4, 2000

(30) Foreign Application Priority Data

May 7, 1999 (JP) .......................... 11-127725

(51) Int. Cl.[7] ............................. H03M 1/62; H03M 1/84
(52) U.S. Cl. ....................................... 341/144; 341/139
(58) Field of Search .................................. 341/144, 145, 341/139, 141

(56) References Cited

U.S. PATENT DOCUMENTS

| | | | | |
|---|---|---|---|---|
| 4,686,507 A | * | 8/1987 | Kessler | 340/347 |
| 4,868,571 A | * | 9/1989 | Inamasu | 341/118 |
| 4,873,492 A | * | 10/1989 | Myer | 330/86 |
| 4,991,227 A | * | 2/1991 | Kehler, Jr. | 455/221 |
| 4,998,108 A | * | 3/1991 | Ginthner et al. | 341/145 |
| 5,021,753 A | * | 6/1991 | Chapman | 332/103 |
| 5,541,600 A | * | 7/1996 | Blumenkrantz et al. | 341/139 |
| 5,617,060 A | * | 4/1997 | Wilson et al. | 330/129 |

FOREIGN PATENT DOCUMENTS

JP          7-93579          10/1995          ............ H03M/1/70

* cited by examiner

*Primary Examiner*—Peguy JeanPierre
*Assistant Examiner*—Jean Buner JeanGlaude
(74) *Attorney, Agent, or Firm*—Pillsbury Winthrop LLP

(57) ABSTRACT

The most appropriate data of a plurality of level-converted digital data, obtained by level conversion of the input digital data by different conversion factors, is selected based on a signal quality of each of the level converted digital data. The other data of the level-converted digital data is attenuated to or below a predetermined noise level. Switching between previously selected data and newly selected data is effected by cross-fading. The level-converted digital data are D/A converted to respective analog signals.

10 Claims, 5 Drawing Sheets

D/A CONVERSION APPARATUS AND D/A CONVERSION METHOD

BACKGROUND OF THE INVENTION

1. Field of the Invention

This invention relates to D/A conversion apparatus and method of a floating type which perform level conversion of input digital data by different conversion factors, converts the resulting data into analog data, then restores the analog data to an original level of the input digital data, and carries out addition of the analog data, thereby achieving an increased dynamic range of the reproduced sound.

2. Prior Art

In recent years, the conversion accuracy of A/D converters has been improved owing to delta-sigma modulators of higher order, and with this improvement, there is an increasing demand for further enhancement in the resolution and dynamic range of D/A converters. To meet the demand, a D/A conversion apparatus of a floating type has been conventionally developed which uses a D/A converter (hereinafter referred to as the "DAC") having a limited number of bits for conversion, and is capable of realizing a resolution and a dynamic range exceeding respective levels attainable by the limited number of bits for conversion. In this type of converter, when an N-bit (e.g. 20-bit) DAC is used for carrying out D/A conversion of M-bit (M>N: e.g. 24-bit) digital data, if the digital data has P bits (M≧P>N) as effective bits, the digital data is directly subjected to D/A conversion without being further processed, and M−N less significant bits (e.g. four less significant bits) are truncated. On the other hand, if the input level of the digital data is lowered so that the effective word length of the same is reduced to P' bits (P'≦N), the digital data is converted into data obtained by multiplying the same by a conversion factor of $2^{M-N}$, i.e. by shifting the original data toward MSB (most significant bit) by M−N bits so that the M−N less significant bits have a value of zero, and then the resulting level-converted data is subjected to D/A conversion. Whether input digital data is to be subjected to D/A conversion without being further processed or after being multiplied by the conversion factor of $2^{M-N}$ is determined depending on whether an overflow of data occurs when the input digital data is shifted by M−N bits.

In the D/A conversion apparatus constructed as above, when input data has P significant bits as effective bits, the length of word or bits for conversion is sufficiently large, so that the effect of the truncation of the M−N less significant bits is almost negligible (even if a problem occurs due to the truncation, it can be solved e.g. by additionally carrying out dithering as required). On the other hand, when the effective bit length of input data is P' bits, the data is multiplied by the conversion factor of $2^{M-N}$, and the M−N less significant bits thereof are truncated during the D/A conversion. Therefore, in this case, M−N less significant bits of the data which would be truncated if the data were not multiplied by the conversion factor of $2^{M-N}$ can be effectively D/A converted, whereby an increased resolution and an increased dynamic range are achieved. In the latter case, however, since an analog signal output from the DAC also has a magnitude multiplied by $2^{M-N}$, it is required to carry out a level adjustment by multiplying the analog output by $1/2^{M-N}$.

The D/A conversion apparatus of the floating type constructed as above includes one which employs a single DAC and the gain of an amplifier that amplifies an output from the single DAC is switched according to the conversion factor by which the level of input digital data is converted, and another which employs a plurality of DAC's that perform D/A conversion of plural pieces of digital data obtained through level conversion of input digital data by respective different conversion factors, and one of the outputs from the DAC's which has been subjected to the level conversion by the most appropriate conversion factor is selected (Japanese Patent Publication (Kokoku) No. 7-93579).

However, according to the former floating-type D/A conversion apparatus, since it is required to switch the gain of the analog amplifier instantaneously according to the level of the digital data, the output of the amplifier cannot follow up the switching, or DC offset of the amplifier can fluctuate, which can produce untoward noise which is audible. The latter floating-type D/A conversion apparatus also switches between analog signals output from the DAC's, so that transient noise occurs upon the switching. These problems are extremely serious particularly when the resolution of digital data to be subjected to D/A conversion covers even a low noise range e.g., an SN ratio of 120 to 140 dB which can be conventionally realized only by analog circuitry.

SUMMARY OF THE INVENTION

It is an object of the present invention to provide a D/A conversion apparatus and a D/A conversion method which are of a floating type and capable of further minimizing the adverse influence of noise to thereby achieve an increased dynamic range.

To attain the above object, according to a first aspect of the invention, there is provided a D/A conversion apparatus comprising a digital signal processor that carries out level conversion of same input digital data by different conversion factors into a plurality of level-converted digital data, selects and outputs most appropriate data of the plurality of level-converted digital data based on a signal quality of each of the plurality of level-converted digital data, outputs other data of the plurality of level-converted digital data after attenuating the other data to or below a predetermined noise level, and switches between data previously selected as the most appropriate data and data newly selected as the most appropriate data by carrying out cross-fading between the previously selected data and the newly selected data, a plurality of D/A converters that carry out D/A conversion of the plurality of level-converted digital data output from the digital signal processor to respective analog signals and outputs the analog signals, and an analog adder device that carries out level conversion of the analog signals output from the plurality of D/A converters again based on respective corresponding ones of the conversion factors in a manner such that resulting analog signals have a level corresponding to a level of the input digital data, and then adds together all of the level-converted analog signals, wherein the digital signal processor carries out the switching over a predetermined cross-fading time period when an amplitude level of the input digital data crosses a predetermined threshold level from a larger side than the predetermined threshold level to a smaller side than the predetermined threshold level, insofar as the amplitude level of the input digital data does not cross the predetermined threshold level from the smaller side to the larger side for a predetermined hold time period, and wherein the predetermined threshold level comprises a plurality of threshold levels, the predetermined hold time period and the predetermined cross-fading time period being set in a manner corresponding to each of the plurality of threshold levels such that as the predetermined threshold level is smaller, the predetermined hold time period and the predetermined cross-fading time period are set to respective shorter time periods.

According to this D/A conversion apparatus, (1) results of a plurality of digital data obtained by D/A conversion are added for analog output, (2) switching of outputs of D/A conversion is carried out by switching attenuation degrees of digital data, (3) cross-fading is carried out for switching between converted digital data, and (4) the switching to selected digital data is carried out when a level (amplitude level) of the input digital data crosses a predetermined threshold level from a larger side than the predetermined threshold level to a smaller side than the predetermined threshold level, insofar as the level of the input digital data does not cross the predetermined threshold level from the smaller side to the larger side for a predetermined hold time period. This makes it possible to reduce generation of noises due to switching to a very low level, and at the same time prevent noises from being generated due to frequent switching operations of digital data.

Further, according to the D/A conversion apparatus, there are provided a plurality of threshold levels as the predetermined threshold level, and the predetermined hold time period and the predetermined cross-fading time period are set in a manner corresponding to each of the plurality of threshold levels such that as the predetermined threshold level is smaller, the predetermined hold time period and the predetermined cross-fading time period are set to respective shorter time periods. Therefore, for example, when the level sharply changes from a large level to a small level, the switching of the selected level-converted digital data, i.e., the switching of the range of the input digital data for D/A conversion is promptly carried out. That is, the speed of switching to newly-selected digital data can be changed in a manner adapted to a degree of lowering of D/A conversion accuracy. This makes it possible to enhance the reproducibility of sounds such as a modulation effect.

Preferably, the digital signal processor carries out the cross-fading by setting the predetermined hold time period and the predetermined cross-fading time period to respective time periods corresponding to a largest one of the plurality of threshold levels, when a time period between a time point the amplitude level of the input digital data becomes smaller than the largest one of the plurality of threshold levels and a time point the amplitude level of the input digital data becomes smaller than a next smaller one of the plurality of threshold levels exceeds a predetermined time period, or when the amplitude level of the input digital data becomes lower than the largest one of the plurality of threshold levels, then becomes smaller than the next smaller one of the plurality of threshold levels, and then becomes larger than the next smaller one of the plurality of threshold levels again within the predetermined time period.

According to this preferred embodiment, only when the level (amplitude level) of the input digital data sharply changes from a larger one to a smaller one, the switching of the selected level-converted digital data, i.e. the switching of the range of the input digital data for D/A conversion is promptly carried out, whereas when the level of the input digital data gently changes from a large one to a small one, or when the same only temporarily passes through a range of small levels, the predetermined hold time period and the predetermined cross-fading time period are set to respective largest time periods. Therefore, it is possible to prevent frequent switching of the range of the input digital data for D/A conversion due to superposition of low-frequency components and high-frequency components, and thereby suppress generation of noises.

Preferably, the digital signal processor includes a delay device that delays the input digital data by a second predetermined time period, and a detector that detects the amplitude level of the input digital data before being delayed by the delay device, and wherein the second predetermined time period is set to or larger than a time period required for the cross-fading to be executed, such that the cross-fading is completed when the amplitude level of the input digital data crosses the predetermined threshold level from the smaller side to the larger side.

According to this preferred embodiment, the timing of start of the cross-fading for switching to the newly selected data of the level-converted digital data can be made earlier than timing of start of the D/A conversion of a portion of the input digital data whose level crossed the predetermined threshold level such that the cross-fading is completed before the start of the D/A conversion of the portion, whereby it is possible to prevent part of the input digital data from being clipped.

The present invention employs a method of switching digital data input to the DAC's for increasing the dynamic range. Compared with a method of switching analog signals output from the DAC's, the method of the present invention has an advantage of less noise being produced upon the switching. On the other hand, a D/A converter device having its input level attenuated generates residual noises which are input to the analog adder, and the residual noises have an adverse influence on the increase of the dynamic range. More specifically, assuming that the conversion factor of the input digital data is expressed by G, the residual noises are input to the analog adder after they are multiplied by 1/G, and therefore, as the conversion factor is smaller, the larger residual noises are input to the analog adder. So long as the level of the input digital data is large, the residual noises are negligible, but if the level of the input digital data is small, the level of the resulting residual noises becomes so large that they are not negligible, so that the dynamic range cannot be improved.

To eliminate this inconvenience, it is preferred that the D/A conversion apparatus further includes an analog attenuator circuit that carries out attenuation of medium-to-high frequency components of an analog signal obtained by carrying out the D/A conversion of the other data of the level-converted digital data by a corresponding one of the D/A converters before the analog signal is input to the analog adder device, when the other data is converted by a smaller conversion factor than one of the conversion factors by which the input digital data is converted into the selected most appropriate data.

According to this preferred embodiment, the analog signal obtained by the D/A conversion of non-selected other data of the level-converted digital data is attenuated by the analog attenuator circuit so as to prevent the residual noises of the non-selected digital data from becoming larger than those of the selected digital data which eventually provide a significant analog signal. This prevents the reduction of residual noises in the ultimate analog signal output, i.e. the reduction of the noise floor, from being spoiled even when the analog signals obtained by D/A conversion of the level-converted digital data are added together to form the ultimate analog signal output, to thereby improve the dynamic range. It should be noted that the digital data to be subjected to the analog attenuation is digital data which has at least a larger possibility of the residual noises thereof being larger than those of the selected digital data, i.e. digital data which is subjected to the level conversion by a smaller conversion factor than that by which the selected digital data is subjected to the level conversion. It suffices practically to reduce the level of the analog signal corresponding to the non-selected digital data other than the selected digital data such that it has a noise level lower than the noise level of the analog signal corresponding to the selected digital data.

Further, the analog attenuator circuit attenuates only medium-to-high frequency components of the analog signal from the D/A converter. Therefore, the input impedance of DC components or low freuency components of the analog adder device does not change even if the analog attenuator circuit turns on or off. This suppresses the fluctuation of the output offset caused by fluctuation of the DC gain of the analog adder device, thereby effectively preventing pop noise from being generated when the D/A converter carries out switching operation.

Preferably, the D/A conversion apparatus includes an attenuating signal output device that delivers an attenuation-instructing signal instructing execution of the analog attenuation, to the analog attenuator circuit, when level-converted digital data obtained by converting the input digital data by a largest one of the conversion factors is selected and output.

Preferably, the analog attenuator circuit comprises a low-pass filter.

More preferably, the attenuating signal output device outputs the attenuation-instructing signal in a manner such that the analog attenuator circuit stops attenuation of the analog signal a second predetermined time earlier than start of the cross-fading, when the amplitude level of the input digital data crosses the predetermined threshold level from the smaller side to the larger side, and starts attenuation of the analog signal upon termination of the cross-fading, when the amplitude level of the input digital data crosses the predetermined threshold level from the larger side to the smaller side.

According to this preferred embodiment, it is possible to prevent transient noises from being generated when the analog attenuator circuit starts and stops the analog attenuation.

To attain the above object, according to a second aspect of the invention, there is provided a D/A conversion method comprising the steps of carrying out level conversion of same input digital data by different conversion factors into a plurality of level-converted digital data, respectively, selecting and outputting most appropriate data of the plurality of level-converted digital data based on a signal quality of each of the plurality of level-converted digital data, and outputting other data of the plurality of level-converted digital data after attenuating the other data to or below a predetermined noise level, switching between data previously selected as the most appropriate data of the plurality of level-converted digital data and data newly selected as the most appropriate data by carrying out cross-fading between the previously selected data and the newly selected data, carrying out D/A conversion of the plurality of level-converted digital data to respective analog signals and outputting the analog signals, and carrying out level conversion of the analog signals again based on respective corresponding ones of the conversion factors in a manner such that resulting analog signals have a level corresponding to a level of the input digital data, and then adding together all of the level-converted analog signals, wherein the switching is carried out over a predetermined cross-fading time period when an amplitude level of the input digital data crosses a predetermined threshold level from a larger side than the predetermined threshold level to a smaller side than the predetermined threshold level, insofar as the amplitude level of the input digital data does not cross the predetermined threshold level from the smaller side to the larger side for a predetermined hold time period, and wherein the predetermined threshold level comprises a plurality of threshold levels, the predetermined hold time period and the predetermined cross-fading time period being set in a manner corresponding to each of the plurality of threshold levels such that as the predetermined threshold level is smaller, the predetermined hold time period and the predetermined cross-fading time period are set to respective shorter time periods.

According to the method of the second aspect of the invention, it is possible to obtain the same advantageous effects as obtained by the D/A conversion apparatus of the first aspect of the invention.

The above and other objects, features and advantages of the invention will become more apparent from the following detailed description taken in conjunction of the accompanying drawings.

DETAILED DESCRIPTION

The present invention will now be described in detail with reference to drawings showing an embodiment thereof.

Figure 1:
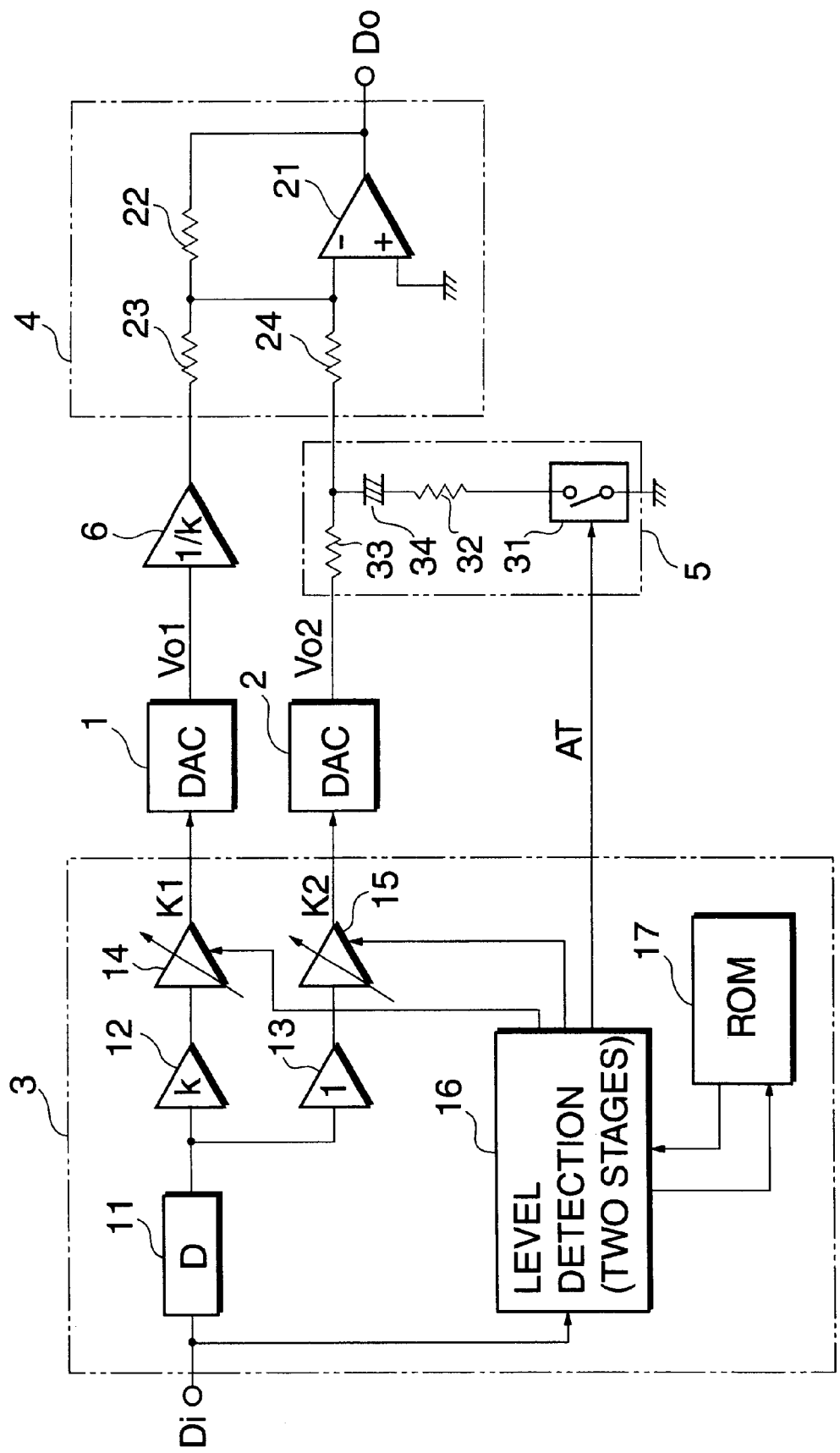
FIG. 1 is a circuit diagram showing the construction of a D/A conversion apparatus according to an embodiment of the present invention.

FIG. 1 shows the whole arrangement of a D/A conversion apparatus according to an embodiment of the invention.

This apparatus is comprised of two D/A conversion systems, i.e. a first D/A conversion system provided with a first DAC 1 having an N-bit conversion accuracy and a second D/A conversion system provided with a second DAC 2 also having an N-bit conversion accuracy. At an upstream stage of the DAC's, there is arranged a digital signal processing circuit, or more specifically, a digital signal processor (hereinafter referred to as "the DSP") 3. The DSP 3 is comprised of a delay circuit 11 for delaying input digital data Di having M (M>N) effective bits as a common input by a predetermined time period T1, a multiplier 12 connected to the delay circuit 11, for multiplying an output from the delay circuit 11 by a factor of k and supplying the same to the DAC 1, another multiplier 13 connected to the delay circuit 11, for directly passing an output from the delay circuit 11 therethrough to the DAC 2, and a pair of cross-faders 14, 15 interposed, respectively, between the multiplier 12 and the DAC 1 and between the multiplier 13 and the DAC 2, which serve as digital attenuation means for selectively attenuating the outputs from the respective multipliers 12, 13 to a value equal to or lower than a noise level of the DAC 1 or 2 as well as for multiplying the outputs by respective coefficients K1, K2 (K1+K2=1) so as to carry out cross-fading when switching is carried out between the outputs to be attenuated. Further, the DSP 3 includes a level detector 16 which are connected to the cross-faders 14, 15, as well as to an analog attenuator circuit 5, referred to hereinafter. The level detector 16 senses a level of the input digital data Di to compare the same with two predetermined threshold values TH1, TH2, and then controls the switching of the cross-faders, 14, 15 and the operation of the analog attenuator circuit 5. Still further, the DSP 3 includes a ROM (Read Only Memory) 17 connected to the level detector 16 and storing parameters, such as the threshold values TH1, TH2 for use in the level detector 16, hold time periods HT1, HT2, and cross-fading time periods CT1, CT2, referred to hereinafter.

In the DSP 3, the level detector 16 shifts the digital data Di toward the most significant bit (MSB) by M−N bits to determine if the most significant bit of the resulting effective bits P does not overflow (P≦N), i.e. if the level of the input data Di does not exceed the maximum amplitude that can be expressed by N bits. If this condition is satisfied, the level detector 16 sets the coefficients K1 and K2 to "1" and "0", respectively, so that the data Di is multiplied by the factor of k and the resulting product k×Di is output to the DAC 1, and data of "0" obtained by digital attenuation of the data D by the coefficient K2 of "0" is output to the DAC 2. On the other hand, if the most significant bit of the effective bits P overflows (P>N), i.e. if the level of the input data Di exceeds the maximum amplitude that can be expressed by N bits, the level detector 16 sets the coefficient K1 and K2 to "0" and "1", respectively, so that the digital data Di with its M−N less significant bits truncated is output to the DAC 2, and data of "0" obtained by digital attenuation of the data D by the coefficient K1 of "0" is output to the DAC 1.

An analog signal Vo1 output from the DAC 1 is attenuated by the factor of 1/k by an attenuator 6 connected thereto and then input to one input of an analog adder 4, while an analog signal Vo2 output from the DAC 2 is directly input to the other input of the analog adder 4 without being attenuated. The analog adder 4 may be implemented by an inverting amplifier comprised of an operational amplifier 21, a feedback resistance 22, and input resistances 23, 24, and adds the analog input signals Vo1/k and Vo2. The analog attenuator circuit 5 is connected between the DAC 2 and the analog adder 4. The analog attenuator circuit 5 may be implemented by a low-pass filter circuit comprised of an analog switch 31 which is connected to the level detector 16 and having one end thereof grounded, and which is turned on in response to an attenuation-instructing signal AT output from the level detector 16 before the DAC 2 starts to receive digitally attenuated data i.e. data of "0" from the cross fader 15, a resistance 32 connected to the other end of the switch 31, a resistance 33 connected to the DAC 2, and a capacitor 34 connected between the resistances 33 and 34 with a junction of the capacitor 34 with the resistance 33 connected to the input resistance 24 of the analog adder 4.

The output Vo from the analog adder 4 in the D/A conversion apparatus configured as above is expressed by the following equation (1):

$$Vo = Vo1/k + Vo2 \tag{1}$$

If original conversion outputs from the respective DAC's 1, 2 obtained when the digital data Di is input are represented respectively by DAC1(Di) and DAC2(Di), and residual noises by VN1 and VN2, the outputs Vo1 and Vo2 from the respective DAC's 1, 2 are expressed by the following equations (2a) and (2b), respectively:

$$Vo1 = k \times DAC1(Di) + VN1 \tag{2a}$$

$$Vo2 = DAC2(Di) + VN2 \tag{2b}$$

Consequently, the output Vo from the analog adder 4 is expressed by the following equation (3):

$$Vo = DAC1(Di) + DAC2(Di) + VN1/k + VN2 \tag{3}$$

Here, the DSP 3 selects one of the conversion outputs DAC1(Di) and DAC2(Di) which consists of more effective bits without an overflow, i.e. which can ensure a more excellent signal quality, and therefore the output Vo is further expressed by the following equation (4):

$$Vo = DAC(Di) + VN1/k + VN2 \tag{4}$$

As is apparent from the equation (4), the noise VN1 output from the DAC 1 is reduced to 1/k, whereas the noise VN2 from the DAC 2 is not reduced, so that the noise floor is determined by the residual noise in the DAC 2. Now, let it be assumed that digital data that is input is formed of 27 bits (M=27) and the DAC's 1, 2 each have a 24-bit conversion accuracy (N=24), i.e. are capable of converting 24 bits. In this case, when the DAC 2 is in operation, since no more than 24 bits of the entire data can be converted, it is impossible to reduce the noise floor to less than a value corresponding to the dynamic range of 144 dB. On the other hand, when the DAC 1 is in operation, it is possible to convert the entire 27-bit data, and therefore the dynamic range can be increased to the proper dynamic range of 162 dB. However, if the residual noise from the DAC 2 is added it is impossible to reduce the noise floor to less than the value corresponding to the dynamic range of 144 dB. To overcome this problem, in the apparatus according to the present embodiment, when the DAC 1 is selected for operation, the attenuation-instructing signal AT is delivered to the analog attenuator circuit 5 to turn it on. As a result, the noise floor during the operation of the DAC 1 is reduced, whereby the dynamic range is increased to the proper dynamic range of 162 dB.

If the input impedance of the operational amplifier 21 changes in dependence on whether the analog attenuator circuit 5 is ON or OFF, the gain of the analog adder 4 changes, which causes fluctuation in output offset voltage of the operational amplifier 21. In general, the amount of offset variation at the output of an operational amplifier is approximately 0.5 mV, which is a very large value when considered in comparison with the resolution of a DAC, which has a noise level of several $\mu$volts (in a 24-bit DAC, 1 LSB≈0.6 $\mu$VRMS). To solve the problem, according to the present embodiment, the analog attenuator circuit 5 is formed of a low-pass filter circuit for attenuating only medium-to-high frequency range components of the analog signal from the DAC 2, whereby the direct current input impedance of the analog adder 4 is prevented from fluctuating due to the ON/OFF operations of the analog attenuator circuit 5.

Figure 2:
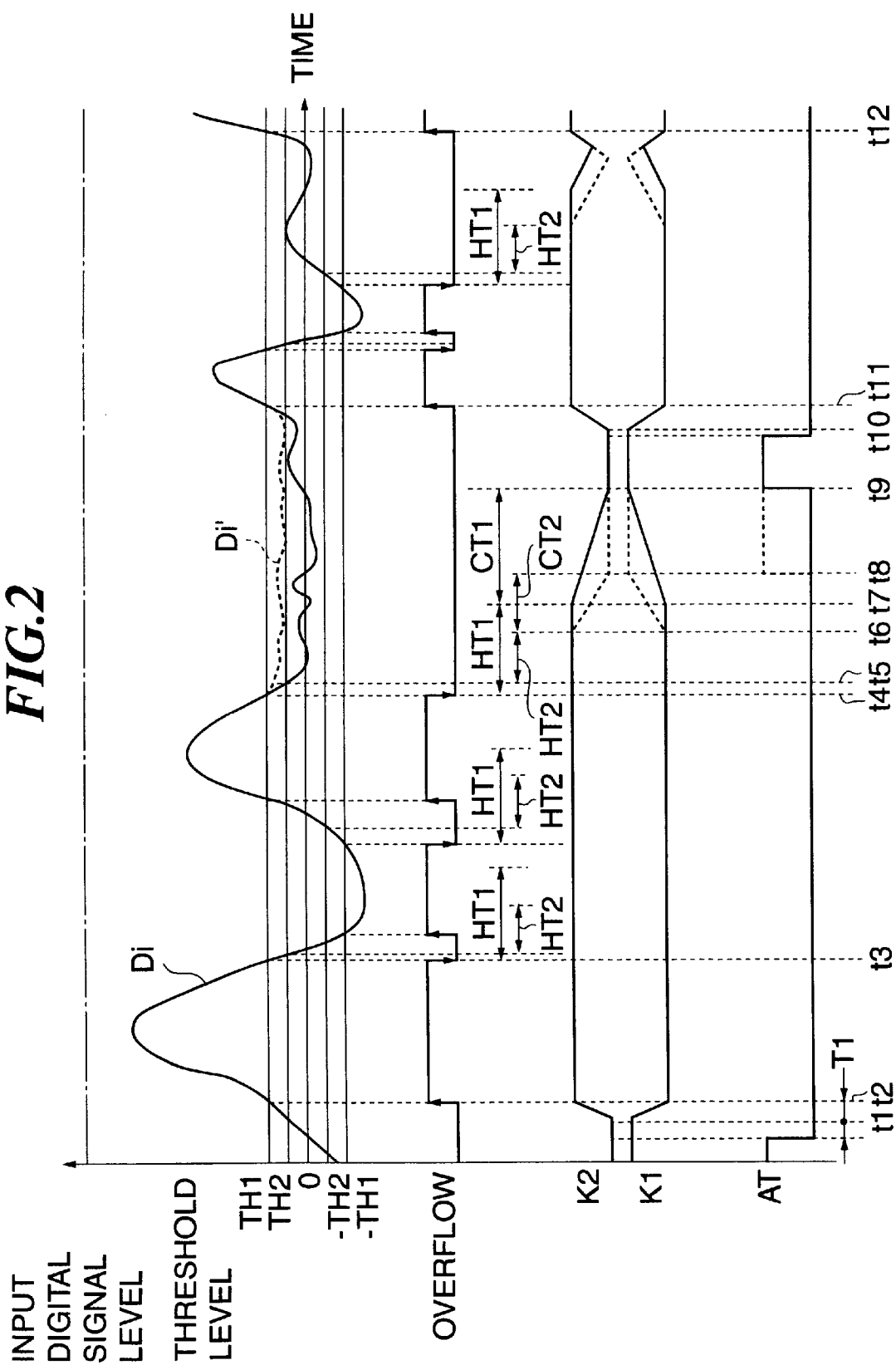
FIG. 2 is a diagram showing a waveform of a digital signal (digital data), which is useful in explaining the operation of the D/A conversion apparatus of FIG. 1.

Referring to FIG. 2, there are shown changes in the level of input digital signal Di and the level of the attenuation-instructing signal AT together with timing of switching performed between the DAC's 1, 2 within the DSP 3.

Switching between the DAC's 1, 2 is carried out in a progressive manner, i.e., through cross-fading so as to prevent transient distortion of the output analog signal, insufficient responsivity to the input digital signal, and occurrence of hop noise, etc. In the circuitry according to the present embodiment, however, the cross-fading carried out for switching from the DAC 1 to the DAC 2 is different from that carried out for switching from the DAC 2 to the DAC 1. Therefore, in the following, these two cases will be described separately.

First, description will be made of the case of switching from the DAC 1 to the DAC 2. As shown in FIG. 2, at a time point t2 the level of the input digital data Di exceeds a predetermined threshold value TH1 (i.e. the aforementioned overflow occurs), the effective output of the analog data is switched from the DAC 1 to the DAC 2. In this case, however, to complete the switching at the time point t2, it is required to start the cross-fading earlier than the time point t2 by the time period T1 required for completion of the cross-fading. The delay circuit 11 is provided for delaying the input signal Di by the time period T1, thereby enabling the level detector 6 to carry out the level detection prior to the input of the input signal Di.

Next, the case of switching from the DAC 2 to the DAC 1 will be explained. This switching is carried out when the signal level (amplitude) of the input digital data Di changes from high to low. In this case, if the switching between the DAC 2 and the DAC 1 is performed whenever the input digital data Di crosses the threshold values +TH1, −TH1, the frequency of the switching operation becomes very high. To prevent this inconvenience, when the level is changed from high to low, i.e. when the level detector 16 detects termination of the overflow, the cross-fading for switching from the DAC 2 to the DAC 1 is not started immediately, but withheld until a predetermined hold time period HT elapses. Then, only when the overflow is not detected again during the hold time period HT, the cross-fading is started. The execution of this process makes it possible to prevent occurrence of switching between the DAC's due to passing of the input digital data Di through a low level range which is detected when the AC signal level changes from +level to −level, or frequent switching between the DAC's caused by a signal waveform containing high-frequency range components, thereby further reducing generation of undesired noises.

However, e.g. in the case of musical information or the like, the level of the signal sometimes changes sharply, and sometimes gently, which makes it difficult to determine how long a time period is to be set to the hold time period HT. If the hold time period HT is set to be too long, responsivity of the circuitry to a signal sharply changed to a very low level is degraded, which causes degradation of reproducibility of the very low-level portion of the signal, whereby the reproduced musical information contains no modulation. On the other hand, if the hold time period HT is set to be too short, switching between the DAC's is performed even when the signal level just continues to be below the threshold value TH for only a very short time period, causing generation of noise.

To overcome this problem, in the present embodiment, the two levels of threshold values TH1, TH2 are provided for comparison with the level of the input signal (input digital data) Di, and two hold time periods HT1 (longer one: e.g. 100 ms), HT2 (shorter one: e.g. 50 ms) and two cross-fading time periods CT1 (longer one: e.g. 100 ms), CT2 (shorter one: e.g. 50 ms) are also provided. For instance, if the bit shift amount (M−N) is three bits, the first threshold value TH1 is set to −18 dB, and the second threshold value TH2 to −36 dB. By comparing the level of the input signal Di with the two threshold values TH1, TH2, it is possible to measure a time interval between respective time points when the signal Di crosses the two values, and thereby determine whether the change of the signal level is sharp or gentle.

Figure 3A:
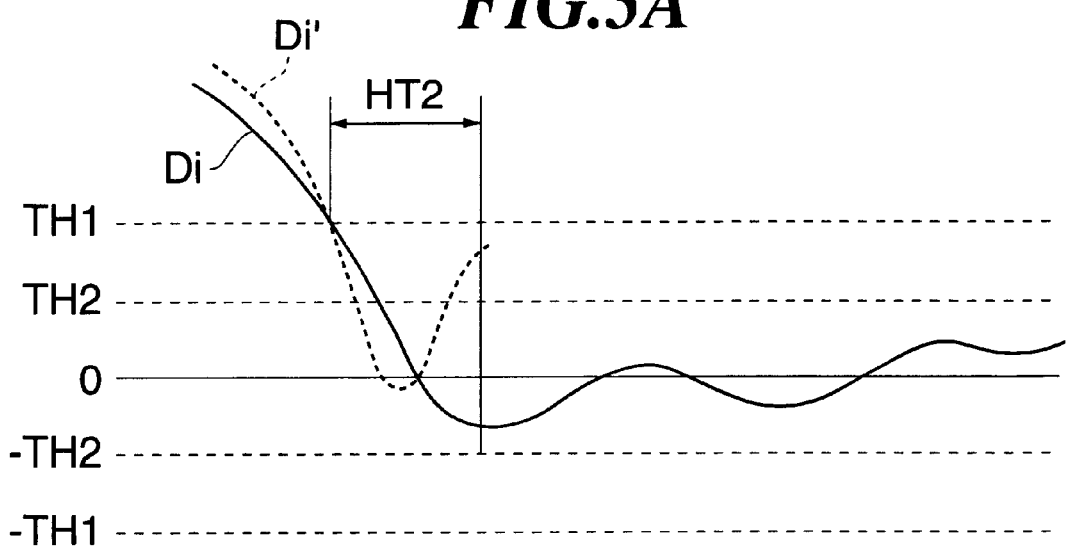
FIG. 3A is a diagram showing a waveform of a digital signal Di presented when the level of the digital signal changes sharply, which is useful in explaining the operation of the D/A conversion apparatus.
Figure 3B:
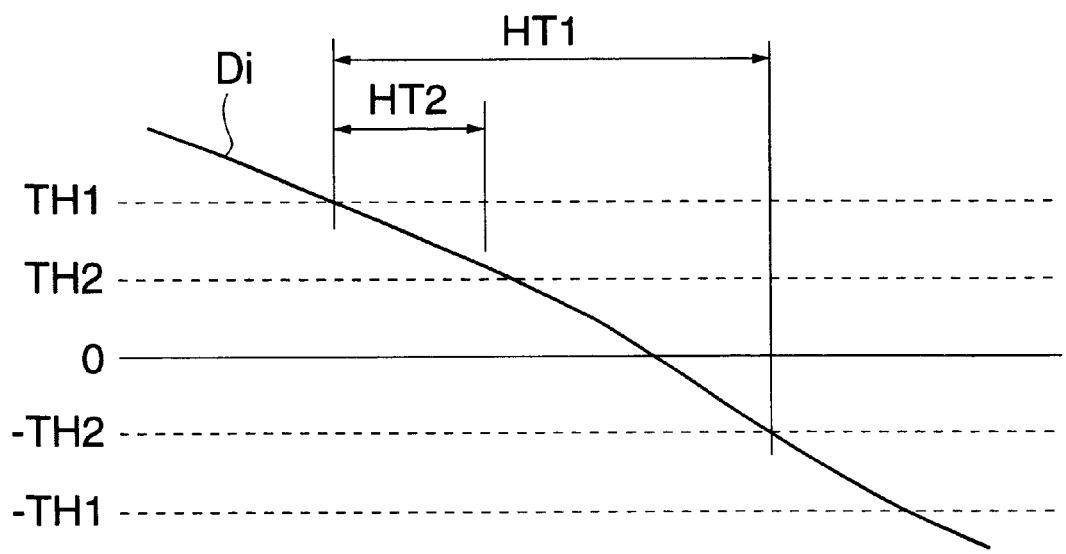
FIG. 3B is a diagram showing a waveform of the digital signal Di presented when the level changes gently, which is useful in explaining the operation of the D/A conversion apparatus.

FIG. 3A shows a case where the level of the input signal Di changes sharply, while FIG. 3B shows a case where the level of the input signal Di changes gently. As shown in the figures, there are set the longer hold time period HT1 and the shorter hold time period HT2. When, as shown in FIG. 3A, the level of the input signal Di becomes lower than the second threshold value TH2 before the shorter hold time period HT2 elapses after the input signal Di became lower than the first threshold value TH1, the change in the level of the input signal Di is determined to be sharp. In this case, if the level of the input signal Di continues to be below the threshold value H2 until after the hold time period HT2 elapses, prompt switching between the DAC's is required, so that the switching is executed with reference to the hold time period HT2. However, when the input signal exceeds the threshold value TH2 again before the lapse of the hold time period HT2 as shown by a signal Di' indicated by a broken line in FIG. 3A, it is regarded as mere passing or transition of the signal level in spite of the sharp level change, and hence switching between the DAC's is not carried out.

On the other hand, when, as shown in FIG. 3B, the input signal Di continues to be at a level equal to or higher than the second threshold value TH1 until the shorter hold time period HT2 elapses after the input signal Di became lower than the first threshold value TH1, the change in the level of the input signal Di is determined to be gentle, and hence the longer hold time period HT1 is used to thereby prevent periodical switching operations of the circuitry in response to low-frequency range components of the input signal.

More specifically, as shown in FIG. 2, counting of the longer hold time period HT1 is started at a time point the input signal Di becomes lower than the threshold value TH1, while counting of the shorter hold time period HT2 is started at a time point the input signal Di becomes lower than the threshold value TH2, whereby it is possible to set an appropriate hold time period according to the slope of the signal amplitude of the input signal Di.

Figure 4:
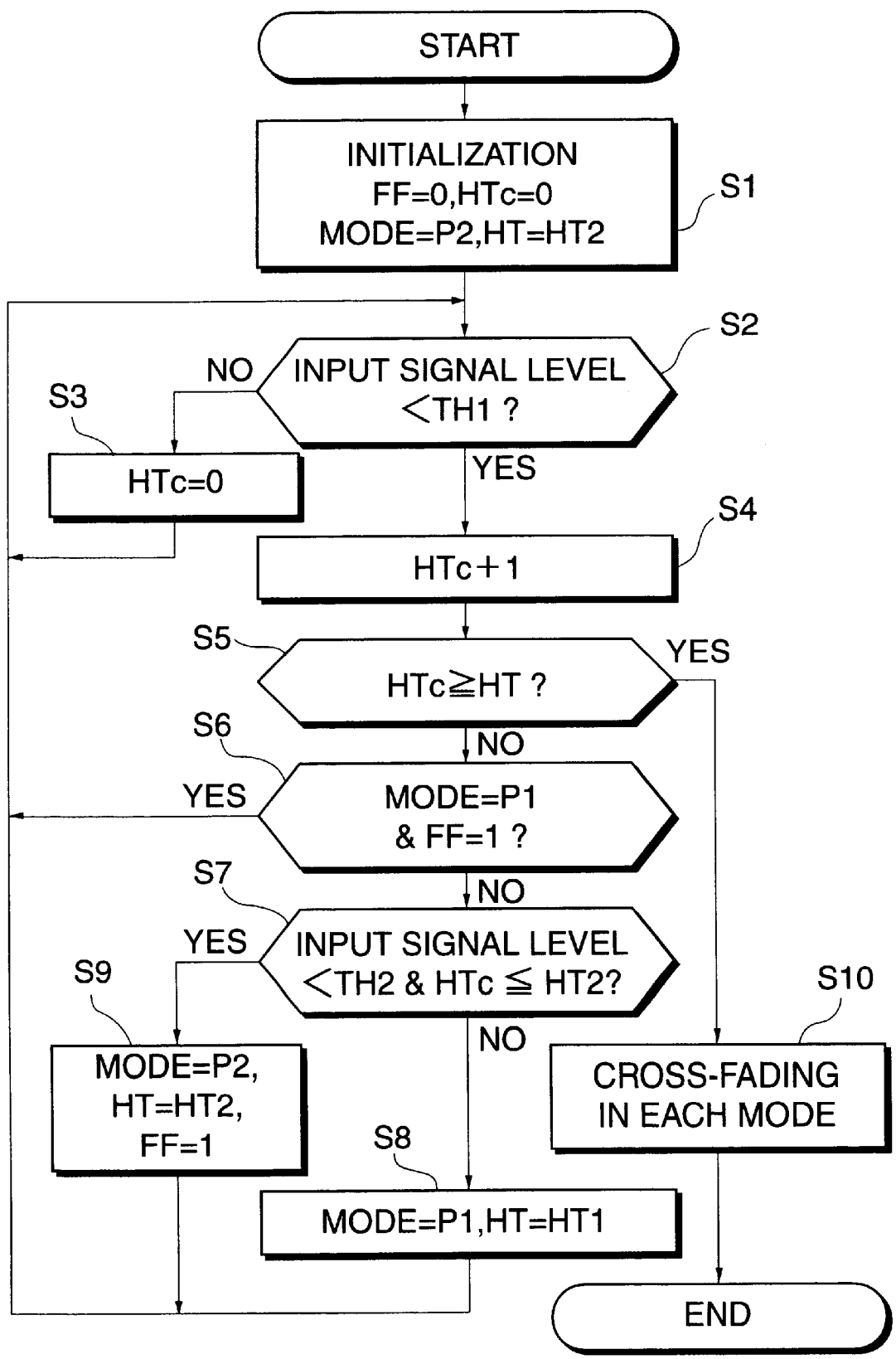
FIG. 4 is a flowchart showing the operation of the D/A conversion apparatus.

FIG. 4 shows a routine for carrying out the cross-fading, particularly, a cross-fading mode-setting operation, which is executed by the D/A conversion apparatus according to the present embodiment. In the following description, P1 designates a mode in which the hold time period HT1 and the cross-fading time period CT1 are selected, and P2 a mode in which the hold time period HT2 and the cross-fading time period CT2 are selected.

First, at a step S1, a flag FF for preventing the apparatus from being shifted to the mode P2 after having been switched from the mode P2 to the mode P1 (except when the mode P2 is set as an initial value) is reset to "0", and the mode P2 in which the hold time period is shorter is selected as an initial value, whereby the hold time HT is set to HT2. At this time point, a counter HTc for counting the hold time period is reset to "0".

Then, the level of the input signal Di is monitored at a step S2. If the level of the input signal Di is not below the first threshold value TH1, the counter HTc is reset at a step S3, and the program returns to the step S2, wherein monitoring of a next portion of the input signal is performed. on the other hand, if the level of the input signal Di is below the first threshold value TH1 at the step S2, the count HTc of the HTc hold time counter is incremented by "1" at a step S4, and then at a step S5, it is determined whether or not the hold time period HT has elapsed.

If the count HTc has not reached the hold time period HT, it is determined at a step S6 whether the mode is set to the mode P1 and at the same time the flip flop FF is set to 1. If the answer to this question is affirmative (YES), the program returns to the step S2, whereas if the answer is negative (NO), the program proceeds to a step S7, wherein it is determined whether or not the level of the input signal Di is below the second threshold value TH2 and at the same time the hold time period HT2 has elapsed. If the signal level is not below TH2 and HTc≦HT2 holds, the change in the level is determined to be gentle, and the program proceeds to a step S8, wherein the mode is set to the mode P1, and the held time period HT to the hold time period HT1. On the other hand, if the signal level is below the hold time period TH2, the change in the level is determined to be sharp, and the program proceeds to a step S9, wherein the mode is set to the mode P2, the hold time period HT is set to the hold time period HT2, and the flag FF is set to "1", whereby once the mode is switched to the mode P1 after this time point, thereafter it is inhibited from being shifted back to the mode P2 until the present cross-fading is completed. In the mode P2, if the signal level again exceeds the threshold value TH2 before the lapse of the hold time period HT (=HT2), it is determined that the input signal Di is temporarily passing through the low-level range, and the mode is set to P1. As described above, monitoring of the level of the input signal Di is continued until the predetermined hold time period elapses, and after the lapse of the time period, the cross-fading is carried out in the mode set as described above at a step S10.

Figure 5A:
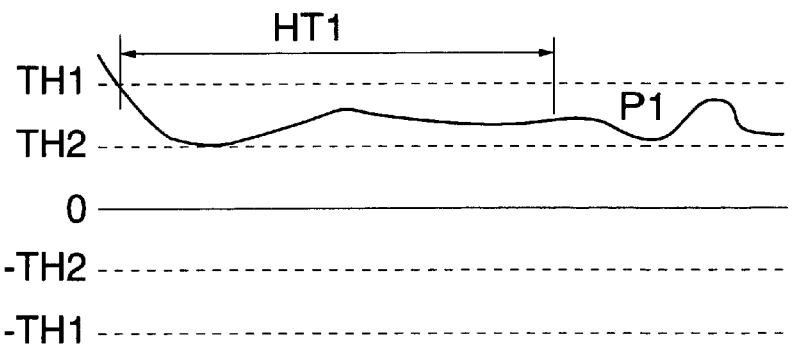
FIGS. 5A, 5B, 5C and 5D are diagrams showing waveforms of the digital signal Di, which is useful in explaining the operation of the D/A conversion apparatus.
Figure 5B:
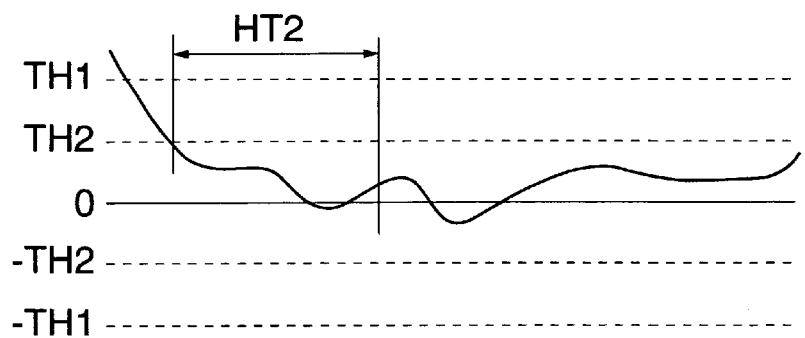
Figure 5C:
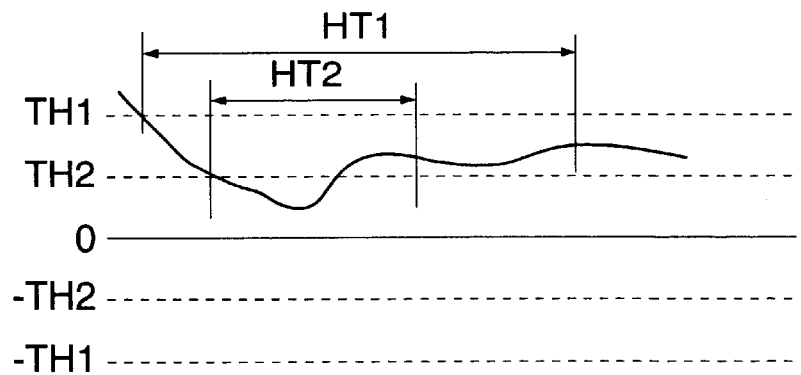
Figure 5D:
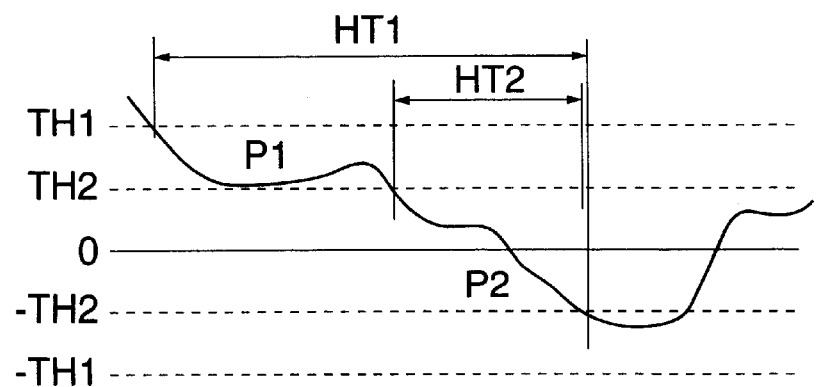

Referring to FIGS. 5A to 5D, there are shown typical examples of the cross-fading mode-setting operation described above. FIG. 5A shows changes in the setting of the mode: P2→P1→P1, which leads to the cross-fading (CT1) executed in the mode P1. FIG. 5B shows changes in the setting of the mode: P2→P2→P2, which leads to the cross-fading (CT2) executed in the mode P2. Further, FIG. 5C shows changes in the setting of the mode: P2→P2→P1, which leads to the cross-fading (CT1) executed in the mode P1. FIG. 5D shows changes in the setting of the mode P2→P1→P2, which leads to the cross-fading (CT1) executed in the mode P1.

By setting the mode of the cross-fading as described above, as to the input signal Di after a time point t4 in FIG. 2, cross-fading is started in the mode P2 at a time point t6 when the hold time period HT2 elapses after the level (amplitude) of the input signal Di sharply dropped below the threshold value TH2, and the mode P2 cross-fading is completed at a time point t8 at which the cross-fading time period CT2 has elapsed since the time point t6. On the other hand, as to the input signal Di', cross-fading is started in the mode P1 at a time point t7 at which the hold time period HT1 has elapsed after the level of the input signal Di' became lower than the threshold value TH1, and the mode P1 cross-fading is completed at a time point t9 at which the cross-fading time period CT1 has elapsed since the time point t7.

As described above, according to the D/A conversion apparatus of the present embodiment, it is possible to carry out switching between the DAC's at a speed depending on the amplitude of an input signal. Further, it is possible to inhibit switching between the DAC's from being performed for low frequency components or components just passing through the low-level range, to thereby prevent generation of undesired noises. It should be noted that in the case of the DAC's 1, 2 having a sampling frequency Fs of 48 KHz, if the first cross-fading time period CT1 is 100 ms, 4800 samples are subjected to the cross-fading, while if the second cross-fading time period CT2 is 50 ms, 2400 samples are subjected to the cross-fading. Further, switching from the DAC 2 to the DAC 1 performed when the level is on the increas should be desirably carried out instantaneously. Therefore, the cross-fading time period should be a time period corresponding to e.g. approximately 20 samples.

Cross-fading of input data to the respective DAC's 1, 2 can be linearly carried out by the cross faders 14, 15 by multiplying the digital data by the coefficients K1, K2 each of which changes linearly. However, to simplify the processing, a method of shifting the digital data bit by bit from the MSB side may be employed. In this case, each of the coefficients K1, K2 is set to change non-linearly such that it is doubled or reduced by half at a time. Alternatively, the cross-fading coefficients K1, K2 may be changed according to a logarithmic curve. This enables the switching operation to be effected in a manner adapted to the aural characteristic of the human being which is logarithmic.

As to the timing for detecting changes in the level of the input signal prior to the switching from the DAC 1 to the DAC 2, the level detector 16 may carry out ON/OFF control of the attenuation-instructing signal AT e.g. two samples before the switching in view of delay of processing of analog circuits such as the analog attenuator circuit 5.

More specifically, when the amplitude level of the input digital data becomes larger than the first threshold value TH1, the level detector 16 delivers the attenuation-instructing signal AT to the analog attenuator circuit 5 such that the analog attenuator circuit stops attenuation of the analog signal a predetermined time earlier than start of the cross-fading, and when the amplitude level of the input digital data becomes smaller than the first threshold value TH1, the level detector 16 delivers the attenuation-instructing signal AT to the analog attenuator circuit 5 such that the analog attenuator circuit 5 starts attenuation of the analog signal upon termination of the cross-fading.

It should be noted that the present invention is not limited to the above described embodiment. For example, although in the above embodiment, the two threshold values different in level are provided, more than two threshold values different in level may be used and different hold time periods and cross-fading time periods may be set accordingly.

Further, although only two DAC's are used in the above described embodiment, the present invention is applicable to an apparatus using more than two DAC's.

What is claimed is:

1. A D/A conversion apparatus comprising:
   a digital signal processor that carries out level conversion of input digital data by different conversion factors into a plurality of level-converted digital data, selects and outputs most appropriate data of the plurality of level-converted digital data based on a signal-to-noise ratio of each of said plurality of level-converted digital data, outputs other data of said plurality of level-converted digital data after attenuating the other data to or below a predetermined noise level, and switches between data previously selected as said most appropriate data and data newly selected as said most appropriate data by carrying out cross-fading between said previously selected data and said newly selected data;
   a plurality of D/A converters that carry out D/A conversion of said plurality of level-converted digital data output from said digital signal processor to respective analog signals and outputs said analog signals; and
   an analog adder device that carries out level conversion of said analog signals output from said plurality of D/A converters again based on respective corresponding ones of said conversion factors in a manner such that resulting analog signals have a level corresponding to a level of said input digital data, and then adds together all of the level-converted analog signals;

wherein said digital signal processor carries out said switching over a predetermined cross-fading time period when an amplitude level of said input digital data crosses a predetermined threshold level from a larger side than said predetermined threshold level to a smaller side than said predetermined threshold level, insofar as the amplitude level of said input digital data does not cross said predetermined threshold level from said smaller side to said larger side for a predetermined hold time period, and said predetermined threshold level comprises a plurality of threshold levels, said predetermined hold time period and said predetermined cross-fading time period being set in a manner corresponding to each of said plurality of threshold levels such that as said predetermined threshold level is smaller, said predetermined hold time period and said predetermined cross-fading time period are set to respective shorter time periods.

2. A D/A conversion apparatus according to claim 1, wherein said digital signal processor carries out said cross-fading by setting said predetermined hold time period and said predetermined cross-fading time period to respective time periods corresponding to a largest one of said plurality of threshold levels, when a time period between a time point the amplitude level of said input digital data becomes smaller than said largest one of said plurality of threshold levels and a time point the amplitude level of said input digital data becomes smaller than a next smaller one of said plurality of threshold levels exceeds a predetermined time period, or when the amplitude level of said input digital data becomes lower than said largest one of said plurality of threshold levels, then becomes smaller than said next smaller one of said plurality of threshold levels, and then becomes larger than said next smaller one of said plurality of threshold levels again within said predetermined time period.

3. A D/A conversion apparatus according to claim 1, wherein said digital signal processor includes a delay device that delays said input digital data by a second predetermined time period, and a detector that detects the amplitude level of said input digital data before being delayed by said delay device, and wherein said second predetermined time period is set to or larger than a time period required for said cross-fading to be executed, such that said cross-fading is completed when the amplitude level of said input digital data crosses said predetermined threshold level from said smaller side to said larger side.

4. A D/A conversion apparatus according to claim 1, further including an analog attenuator circuit that carries out attenuation of medium-to-high frequency components of an analog signal obtained by carrying out said D/A conversion of said other data of said level-converted digital data by a corresponding one of said D/A converters before said analog signal is input to said analog adder device, when said other data is converted by a smaller conversion factor than one of said conversion factors by which said input digital data is converted into said selected most appropriate data.

5. A D/A conversion apparatus according to claim 4, wherein said analog attenuator circuit comprises a low-pass filter.

6. A D/A conversion apparatus according to claim 4, including an attenuating signal output device that delivers an attenuation-instructing signal instructing execution of said analog attenuation, to said analog attenuator circuit, when level-converted digital data obtained by converting the input digital data by a largest one of said conversion factors is selected and output.

7. A D/A conversion apparatus according to claim 6 wherein said attenuating signal output device outputs said attenuation-instructing signal in a manner such that said analog attenuator circuit stops attenuation of said analog signal a second predetermined time earlier than start of said cross-fading, when the amplitude level of said input digital data crosses said predetermined threshold level from said smaller side to said larger side, and starts attenuation of said analog signal upon termination of said cross-fading, when the amplitude level of said input digital data crosses said predetermined threshold level from said larger side to said smaller side.

8. A D/A conversion method comprising the steps of:

carrying out level conversion of input digital data by different conversion factors into a plurality of level-converted digital data, respectively;

selecting and outputting most appropriate data of said plurality of level-converted digital data based on a signal-to-noise ratio of each of said plurality of level-converted digital data, and outputting other data of said plurality of level-converted digital data after attenuating said other data to or below a predetermined noise level;

switching between data previously selected as said most appropriate data of said plurality of level-converted digital data and data newly selected as said most appropriate data by carrying out cross-fading between said previously selected data and said newly selected data;

carrying out D/A conversion of said plurality of level-converted digital data to respective analog signals and outputting said analog signals; and carrying out level conversion of said analog signals again based on respective corresponding ones of said conversion factors in a manner such that resulting analog signals have a level corresponding to a level of said input digital data, and then adding together all of the level-converted analog signals;

wherein said switching is carried out over a predetermined cross-fading time period when an amplitude level of said input digital data crosses a predetermined threshold level from a larger side than said predetermined threshold level to a smaller side than said predetermined threshold level, insofar as the amplitude level of said input digital data does not cross said predetermined threshold level from said smaller side to said larger side for a predetermined hold time period, and said predetermined threshold level comprises a plurality of threshold levels, said predetermined hold time period and said predetermined cross-fading time period being set in a manner corresponding to each of said plurality of threshold levels such that as said predetermined threshold level is smaller, said predetermined hold time period and said predetermined cross-fading time period are set to respective shorter time periods.

9. A D/A conversion apparatus comprising:

a digital signal processor that carries out level conversion of input digital data by different conversion factors into a plurality of level-converted digital data, selects and outputs most appropriate data of the plurality of level-converted digital data based on a signal-to-noise ratio of each of said plurality of level-converted digital data, outputs other data of said plurality of level-converted digital data after attenuating the other data to or below a predetermined noise level, and switches between data previously selected as said most appropriate data and data newly selected as said most appropriate data by carrying out cross-fading between said previously selected data and said newly selected data;

a plurality of D/A converters that carry out D/A conversion of said plurality of level-converted digital data output from said digital signal processor to respective analog signals and outputs said analog signals; and an analog adder device that carries out level conversion of said analog signals output from said plurality of D/A converters again based on respective corresponding ones of said conversion factors in a manner such that resulting analog signals have a level corresponding to a level of said input digital data, and then adds together all of the level-converted analog signals;

wherein said digital signal processor carries out said switching over a predetermined cross-fading time period when an amplitude level of said input digital data crosses a predetermined threshold level from a higher level than said predetermined threshold level to a lower level than said predetermined threshold level, insofar as the amplitude level of said input digital data does not cross said predetermined threshold level from said lower level to said higher level for a predetermined hold time period, and said predetermined threshold level comprises a plurality of threshold levels, said predetermined hold time period and said predetermined cross-fading time period being set in a manner corresponding to each of said plurality of threshold levels such that as said predetermined threshold level is lower, said predetermined hold time period and said predetermined cross-fading time period are set to respective shorter time periods.

10. A D/A conversion method comprising the steps of:

carrying out level conversion of input digital data by different conversion factors into a plurality of level-converted digital data, respectively;

selecting and outputting most appropriate data of said plurality of level-converted digital data based on a signal-to-noise ratio of each of said plurality of level-converted digital data, and outputting other data of said plurality of level-converted digital data after attenuating said other data to or below a predetermined noise level;

switching between data previously selected as said most appropriate data of said plurality of level-converted digital data and data newly selected as said most appropriate data by carrying out cross-fading between said previously selected data and said newly selected data;

carrying out D/A conversion of said plurality of level-converted digital data to respective analog signals and outputting said analog signals; and carrying out level conversion of said analog signals again based on respective corresponding ones of said conversion factors in a manner such that resulting analog signals have a level corresponding to a level of said input digital data, and then adding together all of the level-converted analog signals;

wherein said switching is carried out over a predetermined cross-fading time period when an amplitude level of said input digital data crosses a predetermined threshold level from a higher level than said predetermined threshold level to a lower level than said predetermined threshold level, insofar as the amplitude level of said input digital data does not cross said predetermined threshold level from said lower level to said higher level for a predetermined hold time period, and said predetermined threshold level comprises a plurality of threshold levels, said predetermined hold time period and said predetermined cross-fading time period being set in a manner corresponding to each of said plurality of threshold levels such that as said predetermined threshold level is lower, said predetermined hold time period and said predetermined cross-fading time period are set to respective shorter time periods.

* * * * *